(12) United States Patent
Frey (10) Patent No.: US 8,637,996 B2
(45) Date of Patent: Jan. 28, 2014

(54) PERFORATION PATTERNED ELECTRICAL INTERCONNECTS

(71) Applicant: ITN Energy Systems, Inc., Littleton, CO (US)

(72) Inventor: Jonathan Frey, Denver, CO (US)

(73) Assignee: ITN Energy Systems, Inc., Littleton, CO (US)

( * ) Notice: Subject to any disclaimer, the term of this patent is extended or adjusted under 35 U.S.C. 154(b) by 0 days.

(21) Appl. No.: 13/717,364

(22) Filed: Dec. 17, 2012

(65) Prior Publication Data

US 2013/0154113 A1   Jun. 20, 2013

Related U.S. Application Data

(60) Provisional application No. 61/576,246, filed on Dec. 15, 2011.

(51) Int. Cl.
*H01L 23/48* (2006.01)
*H01L 23/52* (2006.01)
*H01L 29/40* (2006.01)

(52) U.S. Cl.
USPC ............. 257/774; 257/E21.586; 257/E23.011

(58) Field of Classification Search
USPC ............................ 257/774, E21.586, E23.011
See application file for complete search history.

(56) References Cited

U.S. PATENT DOCUMENTS

| | | |
|---|---|---|
| 6,139,987 A | 10/2000 | Koo et al. |
| 2004/0067417 A1 | 4/2004 | Oosawa et al. |
| 2004/0185336 A1 | 9/2004 | Ito et al. |
| 2007/0012244 A1 | 1/2007 | Klaassen |
| 2009/0159582 A1 | 6/2009 | Chami et al. |
| 2010/0086851 A1 | 4/2010 | Wang et al. |
| 2010/0227214 A1 | 9/2010 | Krasnov et al. |
| 2011/0117417 A1 | 5/2011 | Pitts |

OTHER PUBLICATIONS

PCT International Search Report and Written Opinion in International Application PCT/US2012/056685, mailed Nov. 30, 2012, 8 pgs.

*Primary Examiner* — David S Blum
(74) *Attorney, Agent, or Firm* — Merchant & Gould PC (57) ABSTRACT

This disclosure describes systems and methods for increasing the usable surface area of electrical contacts within a device, such as a thin film solid state device, through the implementation of electrically conductive interconnects. Embodiments described herein include the use of a plurality of electrically conductive interconnects that penetrate through a top contact layer, through one or more multiple layers, and into a bottom contact layer. The plurality of conductive interconnects may form horizontal and vertical cross-sectional patterns. The use of lasers to form the plurality of electrically conductive interconnects from reflowed layer material further aids in the manufacturing process of a device.

20 Claims, 7 Drawing Sheets

PERFORATION PATTERNED ELECTRICAL INTERCONNECTS

RELATED APPLICATIONS

This application claims the benefit of U.S. Provisional Application No. 61/576,246, filed Dec. 15, 2011, which application is hereby incorporated by reference.

GOVERNMENT LICENSE RIGHTS

This invention was made with government support under grant number DE-AR0000019 awarded by the Department of Energy. The government has certain rights in the invention.

INTRODUCTION

Solid state batteries, solar cells, and semiconductor devices may use electrically conductive interconnects. In conjunction with these devices, electrically conductive interconnects may be used in thin film, solid state, electrochemical, and other electrical integration schemes. Of these electrical integration schemes, solid state devices have the advantage of being composed of solid materials. This composition allows solid state devices to operate in a variety of conditions. These conditions may include varied physical orientations and a wide temperature range. Additionally, electrochemical devices are capable of either deriving electrical energy from a chemical process, or facilitating a chemical process with the introduction of electrical energy. Thin materials, which may only be nanometers or micrometers thick, compose thin film devices. Using thin film devices may provide weight and size advantages.

When using electrically conductive interconnects with these electrical integration schemes, metrics affecting performance include electrical contact resistance and manufacturing tolerance. Electrical contact resistance is the contribution to the total resistance of a current path caused by contact between two substances. A reduced contact resistance may often be desired because it reduces the overall power loss of a system. This may make the system more energy efficient. Additionally, manufacturing tolerance describes the permissible limit of variation in a physical dimension or spatial orientation of a manufactured a device. A high tolerance often makes a device easier to manufacture. Using current techniques, it may be difficult to create a manufacturing process that achieves low contact resistance while also allowing for a high manufacturing tolerance.

It is with respect to these and other considerations that embodiments have been made. Also, although relatively specific problems have been discussed, it should be understood that the embodiments should not be limited to solving the specific problems identified herein.

Perforation Patterned Electrical Interconnects

This disclosure describes systems and methods for increasing the usable surface area of electrical contacts within a device, such as a thin film solid state device, through the implementation of electrically conductive interconnects. Embodiments described herein include the use of a plurality of electrically conductive interconnects that penetrate through a top contact layer, through one or more multiple layers, and into a bottom contact layer. The plurality of conductive interconnects may form horizontal and vertical cross-sectional patterns. The use of a plurality of relatively smaller electrically conductive interconnects instead of a single large interconnect improves device performance by increasing the surface area of the contact between the interconnects and the bottom contact layer or other layers.

One aspect of the present disclosure is a multi-layered fabricated electrical device having an increased usable surface area of electrically conductive interconnects. A multi layered fabricated electrical device may increase the usable surface area of electrically conductive interconnects. The device may comprise a bottom contact layer, a top contact layer, and one or more intermediate insulating metal oxide layers between the top contact layer and the bottom contact layer. The top contact layer may include a first top contact layer portion electrically isolated from one or more other top contact layer portions. The first top contact layer portion may include a plurality of spaced apart, electrically conductive interconnects that penetrates the first top contact layer portion in an interconnect-top contact area. The interconnect-top contact area is defined as a minimum rectangular area of a surface of the first top contact layer portion that contains all of the electrically conductive interconnects of the plurality of spaced apart, electrically conductive interconnects such that the interconnect-top contact area includes a top contact material area and an electrically conductive interconnect material area. The percentage of the electrically conductive interconnect material area may be between 10% and 90% of the interconnect-top contact area. The electrically conductive interconnects may be formed of a melted and solidified material from the top contact layer, the one or more intermediate layers, and the bottom contact layer.

Another aspect of the present disclosure is a multi-layered fabricated electrical device having an increased usable surface area of electrically conductive interconnects. The device includes a bottom contact layer; a top contact layer; and one or more intermediate layers between the top contact layer and the bottom contact layer. The top contact layer includes a first top contact layer portion electrically isolated from one or more other top contact layer portions. The first top contact layer portion includes a plurality of spaced apart, electrically conductive interconnects that penetrate the first top contact layer portion in an interconnect-top contact area (defined in greater detail below). The interconnect-top contact area is defined as a minimum rectangular area of a surface of the first top contact layer portion that contains all of the electrically conductive interconnects of the plurality of spaced apart, electrically conductive interconnects such that the interconnect-top contact area includes a top contact material area and an electrically conductive interconnect material area. In embodiments of the device, the percentage of the electrically conductive interconnect material area is between 10% and 90% of the interconnect-top contact area.

These and various other features as well as advantages which characterize the systems and methods described herein will be apparent from a reading of the following detailed description and a review of the associated drawings. Additional features are set forth in the description which follows, and in part will be apparent from the description, or may be learned by practice of the technology. The benefits and features of the technology will be realized and attained by the structure particularly pointed out in the written description and claims hereof as well as the appended drawings.

BRIEF DESCRIPTION OF THE DRAWINGS

Non-limiting and non-exhaustive embodiments are described with reference to the following figures.

DETAILED DESCRIPTION

A device may have multiple layers that may be electrically coupled together. It may be desirous to electrically couple the layers together using electrically conductive interconnects. To accomplish this, one may penetrate the multiple layered device with one or more electrically conductive interconnects.

Figure 1A:
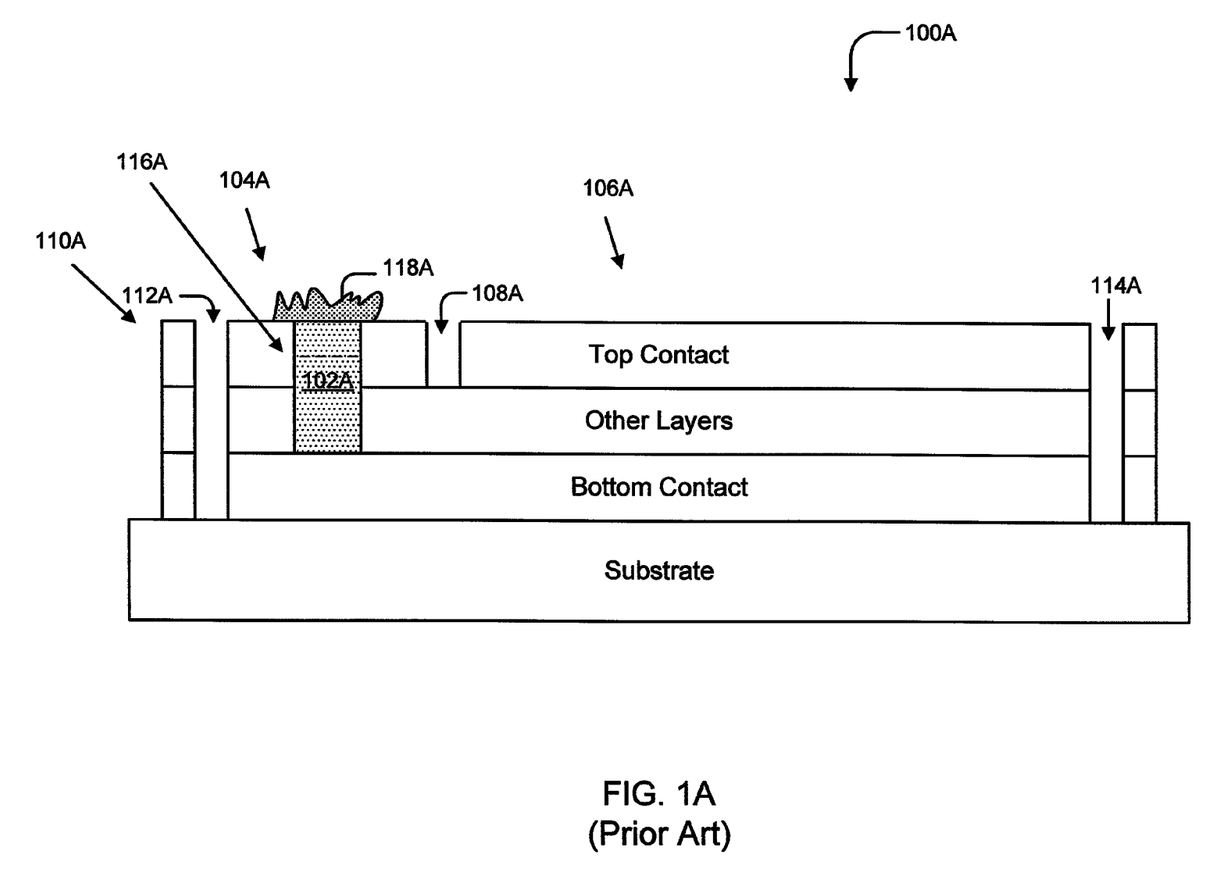
FIG. 1A illustrates a vertical cross-section of an embodiment of a thin film solid state device.

For example, FIG. 1A illustrates a vertical cross-section of an embodiment of a thin film solid state device 100A that includes the use of an electrically conductive interconnect 102A. In the embodiment 100A, the device has a substrate, a bottom contact, other layers, and a top contact. In embodiments, the top contact may be divided into three portions. A first top contact layer portion 104A may be electrically isolated from a second top contact layer portion 106A by an etch 108A. Additionally, the first top contact layer portion 104A may be electrically isolated from a third top contact layer portion 110A by an etch 112A. Other etches, such as etch 114A may further segment the top contact layer and other layers.

Figure 1B:
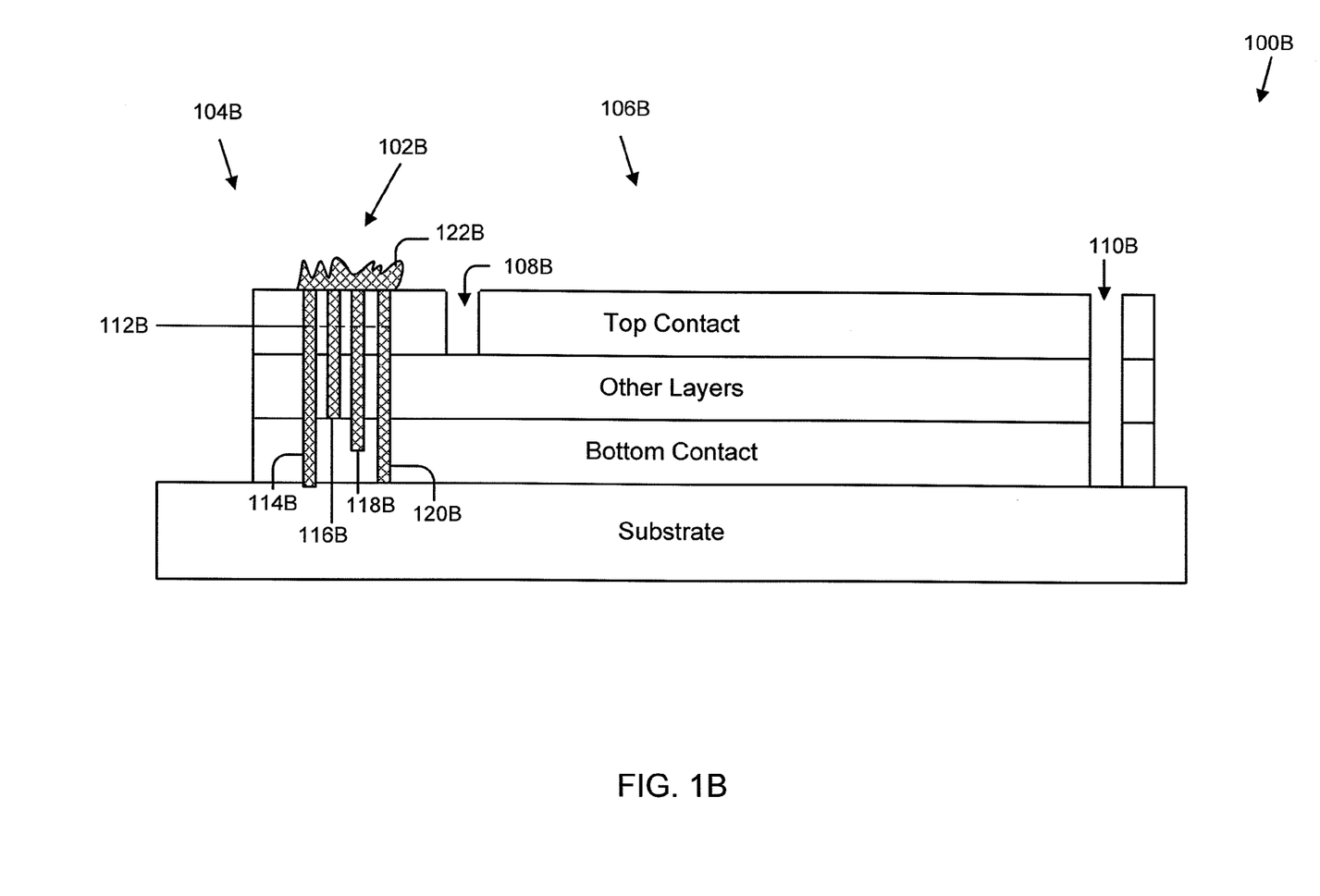
FIG. 1B illustrates a vertical cross-section of an alternative embodiment of a thin film solid state device.

An alternative embodiment of a thin film solid state device is illustrated in FIG. 1B. Device 100B may include a top contact layer, other layers, a bottom contact, a substrate, and a plurality of electrically conductive interconnects 102B. Additionally, the top contact layer may be divided into two portions. A first top contact layer portion 104B may be electrically isolated from a second top contact layer portion 106B by an etch 108B. Other etches, such as etch 110B may further segment the top contact layer. Etches may additionally segment other layers, as illustrated by etch 110B, which segments the top contact, the other intermediate layers, and the bottom contact layer.

Electrically conductive interconnects may be formed by using a variety of methods. For example, FIG. 1B illustrates a plurality of electrically conductive interconnects 102B penetrating through at least a top contact layer. In embodiments, this penetration may be caused by the use of a laser, an etching process, or other penetrating devices to create a cavity through the device 100B. The depth to which this cavity is formed may be the same or may be intentionally varied from electrically conductive interconnect to electrically conductive interconnect. For example, electrically conductive interconnect 114B has a different depth than other electrically conductive interconnects in the plurality of electrically conductive interconnects 102B. As illustrated, electrically conductive interconnect 114B may penetrate through to the substrate. A conductive ink or paste may be used to fill the cavity. In other instances, partially filled cavities may be desirous. The resulting electrically conductive interconnect may be said to penetrate the layers where the original cavity was created.

The depth of an electrically conductive interconnect may be predetermined. For example, in the embodiment illustrated in FIG. 1B, the electrically conductive interconnect 114B penetrates into the substrate. This penetration may be as a result of a predetermined depth. Moreover, the depth of other electrically conductive interconnects that make up the plurality may be predetermined. Indeed, in some embodiments, the depth of each electrically conductive interconnect may be independently predetermined. Additionally, the predetermined depth may vary from electrically conductive interconnect to electrically conductive interconnect. For example, electrically conductive interconnect 116B may penetrate through the other layers to the bottom contact. Additionally, electrically conductive interconnect 118B may penetrate to a depth in the middle of the bottom contact, and electrically conductive interconnect 120B may penetrate to the substrate. Varying the depths of the individual electrically conductive interconnects may create a device with particular electric properties.

Further, varying the depth of each electrically conductive interconnect may create a vertical cross-sectional perforation pattern. For example, FIG. 1B illustrates a vertical perforation pattern. In embodiments, electrically conductive interconnects 114B, 116B, 118B, and 120B form an irregular predetermined vertical perforation pattern. In other embodiments, the electrically conductive interconnects 114B, 116B, 118B, and 120B form a regular pattern, such as an alternating high-low pattern, a V-shaped pattern, or a U-shaped pattern.

The device may have an electrically isolating etch that may be used to isolate the device. For example, a battery cell may have an electrically isolating etch that may penetrate all layers of the battery to a substrate. For instance, electrically isolating etch 112A may be used to electrically and/or mechanically isolate the device 100A. In some embodiments a contact layer is deposited after an etch 112A is created and filled with an electrically isolating material.

Additionally, a first top contact layer portion, such as 104A or 104B, may have certain design features related to the location of one or more electrically conductive interconnects. Consider, for example, FIG. 1A's single interconnect 102A. As illustrated, the electrically conductive interconnect 102A penetrates the first top contact layer portion 104A, and the electrically conductive interconnect 102A penetrates through other layers until it contacts a bottom layer. At any plane within the first top contact layer portion 104A there exists a minimum rectangular area that contains all of the electrically conductive interconnect material that penetrates the first top contact layer portion 104A. In the embodiment illustrated in FIG. 1A, there may be only one electrically conductive interconnect. As such, in this embodiment, the minimum rectangular area that contains all of the electrically conductive interconnect material would be the area in a plane that is occupied by the electrically conductive interconnect 102A, assuming the electrically conductive interconnect 102A has a rectangular shape. For example, this may be the area at the plane 116A indicated by the dashed line. When the plane is at the top surface of the top contact, this area will be referred to as "the interconnect-top contact area" to distinguish it from the rest of the surface of the top contact layer.

A conductive bridge 118A may cap the electrically conductive interconnect 102A. This conductive bridge may be formed by using a conductive ink or conductive paste. Alternatively, the conductive bridge 118A may be formed when another conductive layer is deposited over the top contact layer.

In embodiments such as that shown in FIG. 1B in which multiple interconnects are used, the interconnect-top contact area will include a top contact material area (i.e., that portion of the top contact layer surface that is within the interconnect-top contact area) and interconnect material area (i.e., the cross-sectional area of all of the interconnects at the surface of the top contact layer). Alternatively, in the embodiment of FIG. 1A, the interconnect-top contact area does not include any top contact material area, therefore 100% of the interconnect-top contact area is interconnect material area. It should be noted that another plane within the top contact layer portion 104A could be used, such as the bottom surface of the top contact layer portion 104A. It should also be noted that in an embodiment the same material may be used for the top contact layer and for the interconnects, in which the differentiation remains that the interconnect material was added after the cavities were made in the top contact layer so that the distinction between the two areas of the plane remains.

In alternative embodiments, such as FIG. 1B, there may be a plurality of electrically conductive interconnects, which may affect the properties of the interconnect-top contact area. For example, FIG. 1B includes a plurality of electrically conductive interconnects 102B. As illustrated, the plurality of electrically conductive interconnects may penetrate through at least the first top contact layer portion 104B. At any plane within the first contact layer portion 104B there may exist a minimum rectangular area that contains all electrically conductive interconnects that make up the plurality of electrically conductive interconnects 106B. One such plane may be 112B. In embodiments, the interconnect top-contact area would include a top contact material area at that plane. For example, this area may be the area in the plane 112B through which no electrically conductive interconnect passes. Additionally, there may be an electrically conductive interconnect material area at the selected plane. This is the area in the plane through which the plurality of electrically conductive interconnects 102B passes. The top contact material area, the electrically conductive interconnect material area, and the interconnect-top contact area are discussed further with reference to FIGS. 2-6 below.

A conductive bridge 122B may cap the electrically conductive interconnect 102B. This conductive bridge may be formed by using a conductive ink or conductive paste. Alternatively, the conductive bridge 122B may be formed when another conductive layer is deposited over the top contact layer.

Figure 2:
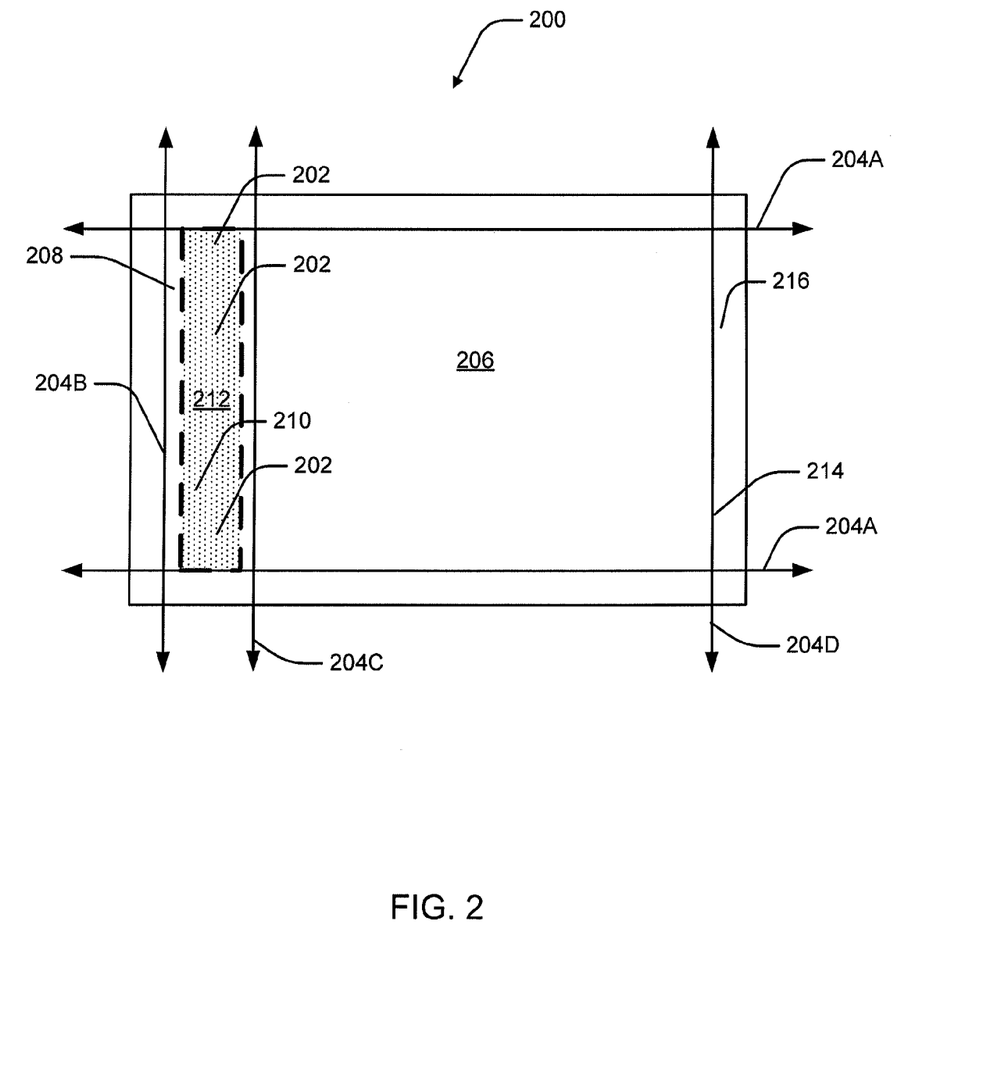
FIG. 2 illustrates a horizontal cross section of an embodiment of a thin film fabricated flexible substrate device.

Turning now to FIG. 2, FIG. 2 illustrates a horizontal plan view of an embodiment of a thin film fabricated flexible substrate device 200 shown in FIG. 1B. The device 200 includes the use of a plurality of electrically conductive interconnects 202. The device 200 may be fabricated in any currently known or later developed manner of thin film fabrication such as but not limited to chemical deposition, physical deposition, and sputtering.

In embodiments, the device 200 may have isolation etches 204A, 204B, 204C and 204D used to electrically and/or mechanically isolate a second top contact layer portion 206 (between lateral etches 204C and 204D) from a first top contact layer portion 208 (between lateral etches 204B and 204C). In some embodiments the etches may be formed by using a laser or other device. Etches may then be filled with a non-conductive fluid or material. Alternatively, the etches may be filled when a non-conductive layer is deposited over the top contact layer.

In the embodiment shown in FIG. 2, the first top contact layer portion 208 is the portion of the top contact layer through which the plurality of electrically conductive interconnects 202 penetrate to a lower layer. Each interconnect may be an individual cavity of the top contact layer portion, and the interconnect may have been filled with electrically conductive material to provide an electrical contact with a lower layer. Additionally, each interconnect may be spaced apart from the other interconnects so that they are not electrically connected within a plane in the device 200. For example, an interconnect in the plurality of electrically conductive interconnects 202 may be used to electrically couple multiple layers together, as well as electrically couple portions of the same layer together. In some embodiments, conductive material such as a conductive paste may be used to fill the interconnects 202. For example, in an embodiment the top contact may be electrically connected with a bottom contact through the plurality of electrically conductive interconnects 202. Each interconnect in the plurality of electrically conductive interconnects 202 is shown as a dot within an area of the first top contact layer portion 208. The top contact layer portion is identified by a dashed boundary for illustration purposes. The dashed boundary of the area 212 shows the interconnect-top contact area 212 at the plane of the surface of the top contact layer of the device.

The plurality of electrically conductive interconnects 202 may have a varied depth based on the tolerance of the etching process, and this variability may result in varying contact areas. For example, the electrically conductive contact area of plurality of electrically conductive interconnects 202 may vary with the depth of the plurality of electrically conductive interconnects 202. If plurality of electrically conductive interconnects 202 penetrate to the top of the target layer, then the plurality of electrically conductive interconnects 202 contact area with the target layer will be determined by the shape of the interconnects' bottom surface. Alternatively, if an interconnect in the plurality of electrically conductive interconnects 202 penetrates to a depth beyond the top of the target layer, such as to the middle of the target layer then the area of contact will be determined by the shape of the interconnects' bottom surface plus the area of the side surfaces of the interconnect that extend into the target layer. Alternatively, if the interconnect 202 is etched entirely through the target layer, and/or into the substrate, then the contact area will be only the area of the side surfaces of the interconnect that extend into the target layer. In some embodiments, such as thin film devices, the thickness of the target layer is small relative to the width of bottom surface area of the interconnects in the plurality of electrically conductive interconnects 202. This may, result in a drastically reduced contact area if the all of plurality of electrically conductive interconnects 202 are etched completely through the layer. It should be noted that the actual contact area may vary as a function of the 3-dimensional shape of each interconnect as well as the material properties of the target layer.

Additionally, the plurality of electrically conductive interconnects 202 may form a perforation pattern 210. The pattern may be regular or irregular as discussed in greater detail below.

With the perforation pattern disclosed herein, a versatile manufacturing process that uses electrical interconnects with a low electrical contact resistance may be designed. This may allow for a high manufacturing tolerance. Additionally, perforation patterned electrical interconnects may be used in a variety of applications such as but not limited to solar cells, batteries, semiconductor devices, coatings, and thick and thin film devices. Additionally, the manufacturing process may be used in connection with a variety of integration schemes, such as electrochemical, solid-state, and electrochemical integration schemes. Various embodiments of thin film devices with etches, as well as thin film devices with perforation patterned interconnects may be used. The perforation patterned electrical interconnects described may be designed to have low electrical contact resistance and high tolerance for out-of-spec fabrication.

Additionally, perforation patterns may vary with respect to the number of perforations, perforation size, and perforation density, that is the relative cross-sectional area of interconnect material to layer material at a specified plane in the device. This variance may be based upon design specifications and the tolerance of the fabrication process. Perforation patterns may be formed through any currently known or later developed methods appropriate for inserting perforations into at least one layer of fabricated material. These methods may include etching and laser scribing.

An embodiment may have an interconnect-top contact area 212 that is a rectangular shape as shown. This area, as defined above, is the minimum area of a single rectangle that contains all the electrically conductive interconnects in a top contact layer portion. For example, in embodiments show in FIG. 2, the plurality of electrically conductive interconnects 202 may be bound by rectangle to define the interconnect-top contact area 212. In such an embodiment, the rectangular area that contains all of the electrically conductive interconnects in a top contact layer portion would be formed by four lines, where the four lines form the smallest rectangle that can contain all the electrically conductive interconnects that pass through a plane.

Specific perforation patterns, such as perforation pattern 210, may be desirable due to a possible increase in electrically conductive contact area as compared to a single conductive etch in embodiments that encompasses all of interconnect-top contact area 212. In embodiments, the plurality of electrically conductive interconnects may consist of electrically conductive interconnects that have the shape of a cylinder. In instances where the interconnects contact but do not penetrate a target lower layer, these electrically conductive interconnects have a contact area of $n\pi r^2$, where n is the number of electrically conductive interconnects contacting the target layer, and r is the radius of the circle that contacts the target layer. In the event that the electrically conductive interconnects penetrate, but do not pass through a target area, the contact area is equal to $n(\pi r2+2\pi r*1)$, where n is the number of electrically conductive interconnects that penetrate the target layer, l is the distance the electrically conductive interconnects penetrated into the target layer, and r is the radius of the cylinder. In the event that the electrically conductive interconnects pass through the target area, the contact area is $n2\pi r*1$, where n is the number of electrically conductive interconnects that pass through the target layer, and r is the radius of the cylinder. This may result in an increased contact area for a plurality of electrically conductive interconnects as compared to a single etch. Different depths may also result in different performance attributes of the device.

Additionally, a perforation pattern 210 may allow for an increased manufacturing tolerance. For example, there may be some variance in depth for a interconnect. The target depth may be some depth x, with a manufacturing tolerance of $\Delta$ and a design tolerance of $\mu$. With a single etch, the design tolerance $\mu$ may be greater than the manufacturing tolerance $\Delta$. This may be desirous because a failure of the single etch depth to be within $\mu$ of the target depth x may result in a device failure. However, a plurality of electrically conductive interconnects may allow for the manufacturing tolerance $\Delta$ to be greater than the design tolerance $\mu$. This may result because the greater number of electrically conductive interconnects, the greater the chance that a certain number of those electrically conductive interconnects fall within the design tolerance $\mu$.

Figure 3:
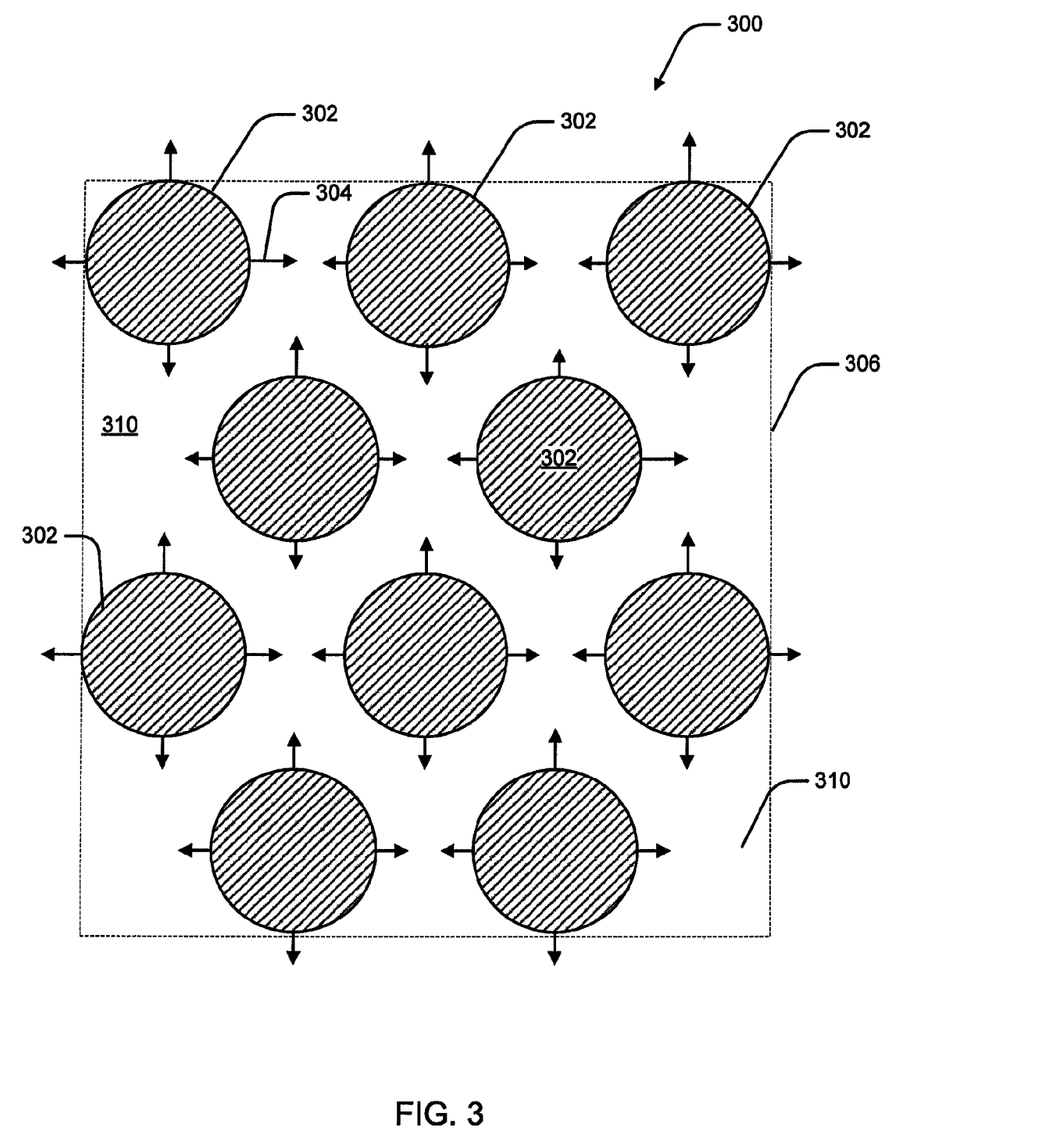
FIG. 3 illustrates a horizontal cross-sectional view of a device with perforation patterned electrical interconnects.

FIG. 3 illustrates a horizontal cross-sectional view of a device with perforation patterned electrical interconnects. In embodiments, a device may have perforation pattern 300 contained within an interconnect-top contact area 306. The interconnect-top contact area 306 may contain an electrically conductive interconnect material area 302 and the top contact material area 310.

In a plane that passes through a top contact layer portion there may exist an electrically conductive interconnect material area 302. The electrically conductive interconnect material area 302 may be the area in the plane that an electrically conductive interconnect passes through. For example, in the horizontal cross-sectional view illustrated in FIG. 3, electrically conductive interconnects pass through the area 302. As illustrated, this area may be a circle. It may also be other shapes, such as squares, as in FIG. 4, polygons, as in FIG. 5, or a combination of shapes, as in FIG. 5.

At a specified plane there is an interconnect-top contact area 306. The interconnect-top contact area is defined as the area containing all of the electrically conductive interconnect areas 302 in the smallest rectangular area that can contain all of the electrically conductive interconnect areas 302. Unless otherwise stated, when discussing the interconnect-top contact area 306 the specified plane is the plane of the surface of the top contact layer.

In embodiments, the area within the interconnect-top contact area that the electrically conductive interconnects do not pass through may be referred to as the top contact material area 310.

A perforation pattern 300 may be formed. This may be a regular pattern. For example, multiple discrete electrically conductive interconnect material areas 302 may form a pattern where the distance between one electrically conductive interconnect material area 302 and another electrically conductive interconnect material area 302 is substantially regular.

Current may flow in a certain way in a horizontal cross-sectional area view of a device with perforation patterned electrically conductive interconnects. Current may not able to travel through the bottom of a layer. Flow may occur, however, due to a current path 304. This flow may be possible through the entire perimeter of the electrically conductive interconnect material area 302. Additionally, the mean current path may be directed through an interconnect towards a next portion of a layer. The current path 304 may extend out of any side of the electrically conductive interconnect material area 302 into the surrounding conductive layer.

Figure 4:
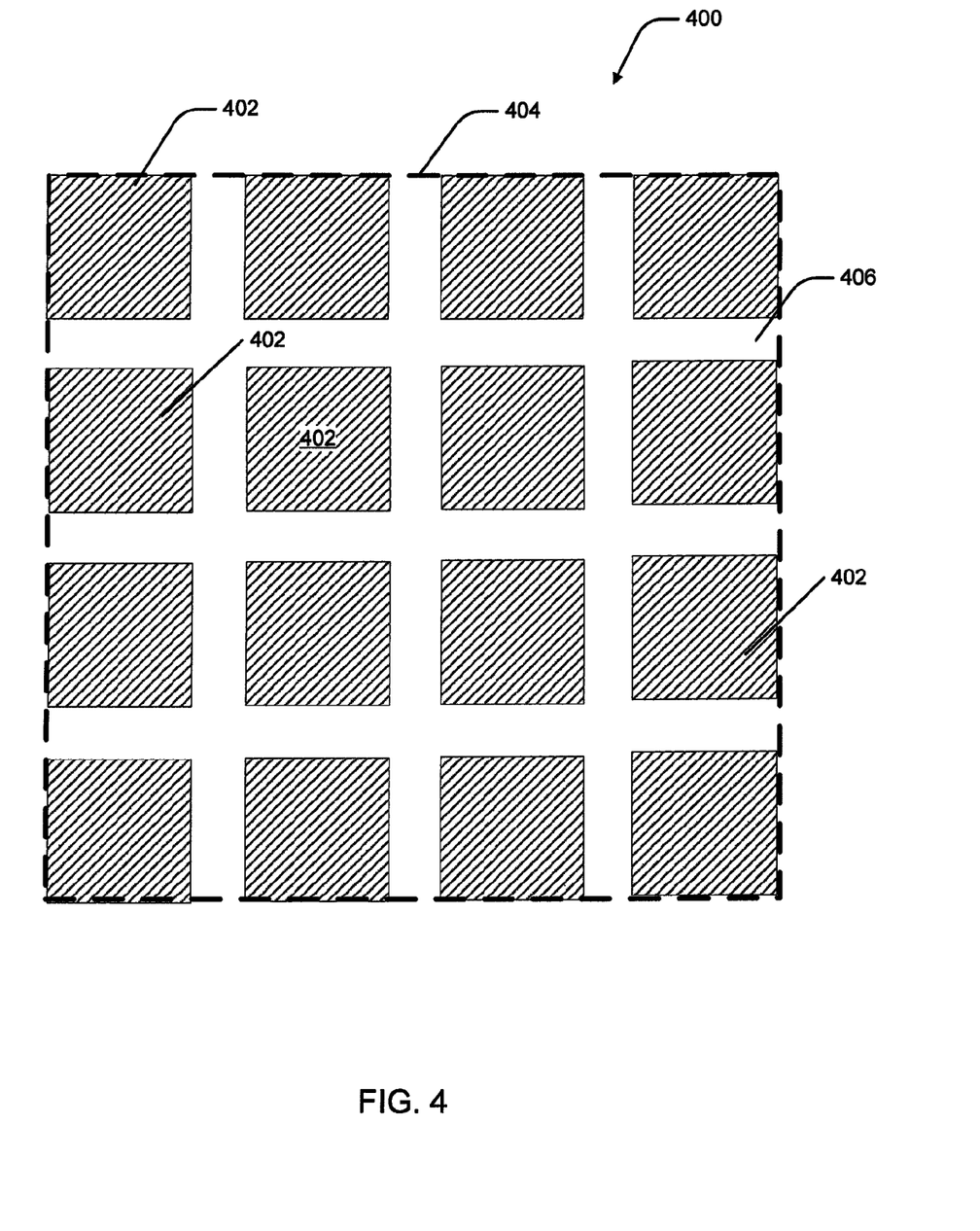
FIG. 4 illustrates a horizontal cross-sectional view of an alternative embodiment of a device with perforation patterned electrical interconnects.

FIG. 4 illustrates a horizontal cross-sectional view of an alternative embodiment of a device with perforation patterned electrical interconnects. In embodiments, a device has a perforation pattern 400 contained within an interconnect-top contact area 404. The interconnect-top contact area includes the electrically conductive interconnect material area 402 and the top contact material area 406. In embodiments, the electrically conductive interconnect material area is a square.

An interconnect-top contact area 404 may be formed by containing all of the electrically conductive interconnect areas 402 in the smallest rectangular area that can contain all of the electrically conductive interconnect areas 402.

A perforation pattern 400 may be formed. This may be a grid pattern. For example, multiple discrete electrically conductive interconnect material areas 402 may form a pattern where parallel areas of top contact material area 406 exist. These areas of top contact material 406 may form a series of intersecting parallel vertical and parallel horizontal areas as illustrated in FIG. 4.

Figure 5:
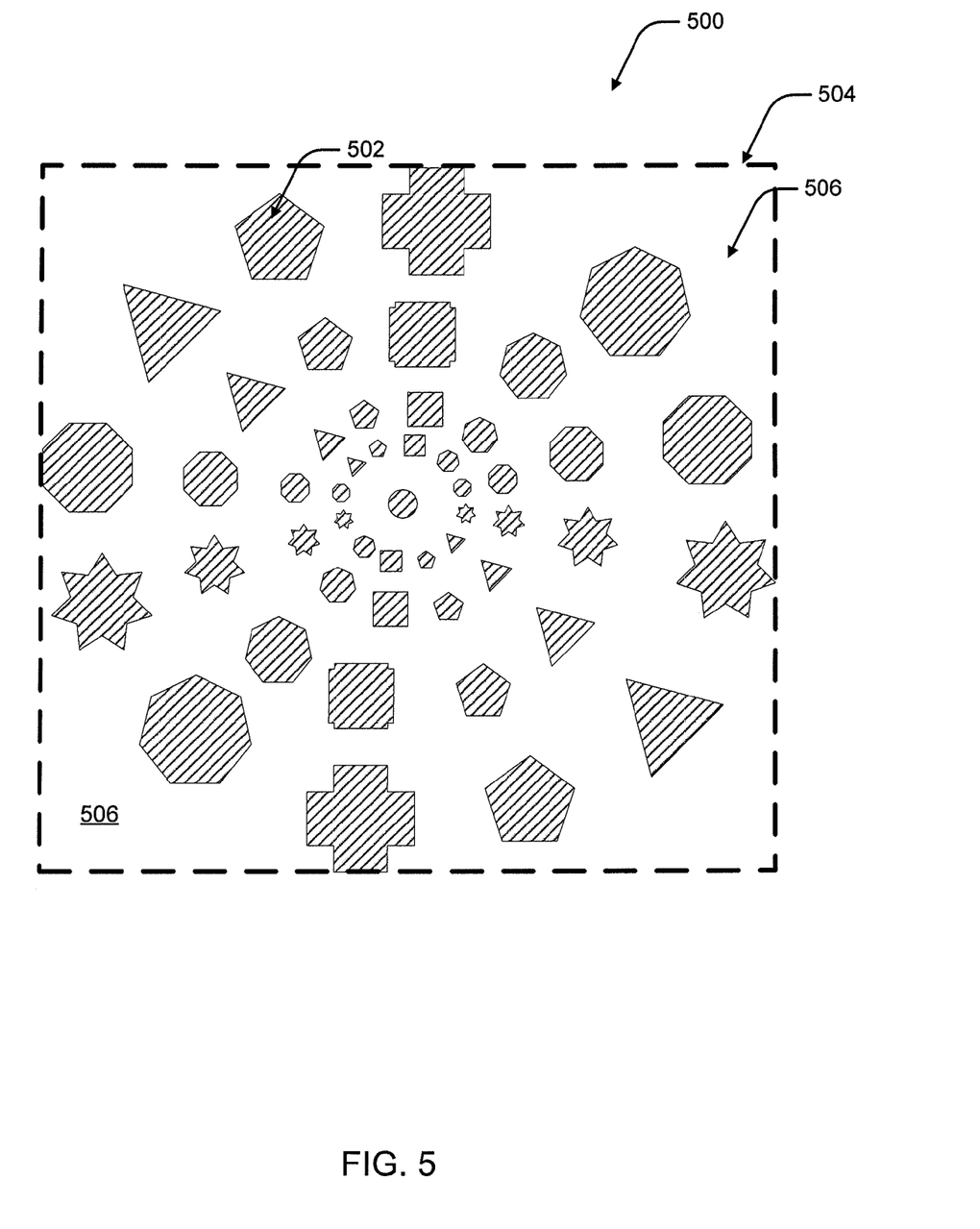
FIG. 5 illustrates a horizontal cross-sectional view of an alternative embodiment of a device with perforation patterned electrical interconnects.

FIG. 5 illustrates a horizontal cross-sectional view of an alternative embodiment of a device with perforation patterned electrical interconnects. In embodiments, a device has a perforation pattern 500 contained within an interconnect-top contact area 504. This interconnect-top contact area includes the electrically conductive interconnect material area 502 and the top contact material area 506. In embodiments, the electrically conductive interconnect material area is a variety of polygons.

An interconnect-top contact area 504 may be formed by containing all of the electrically conductive interconnect areas 502 in the smallest rectangular area that can contain all of the electrically conductive interconnect areas 502.

A perforation pattern 500 may be formed. This may be a concentric circle pattern. For example, multiple discrete electrically conductive interconnect material areas 502 may form a pattern that resembles concentric circles in a top contact material 506.

Figure 6:
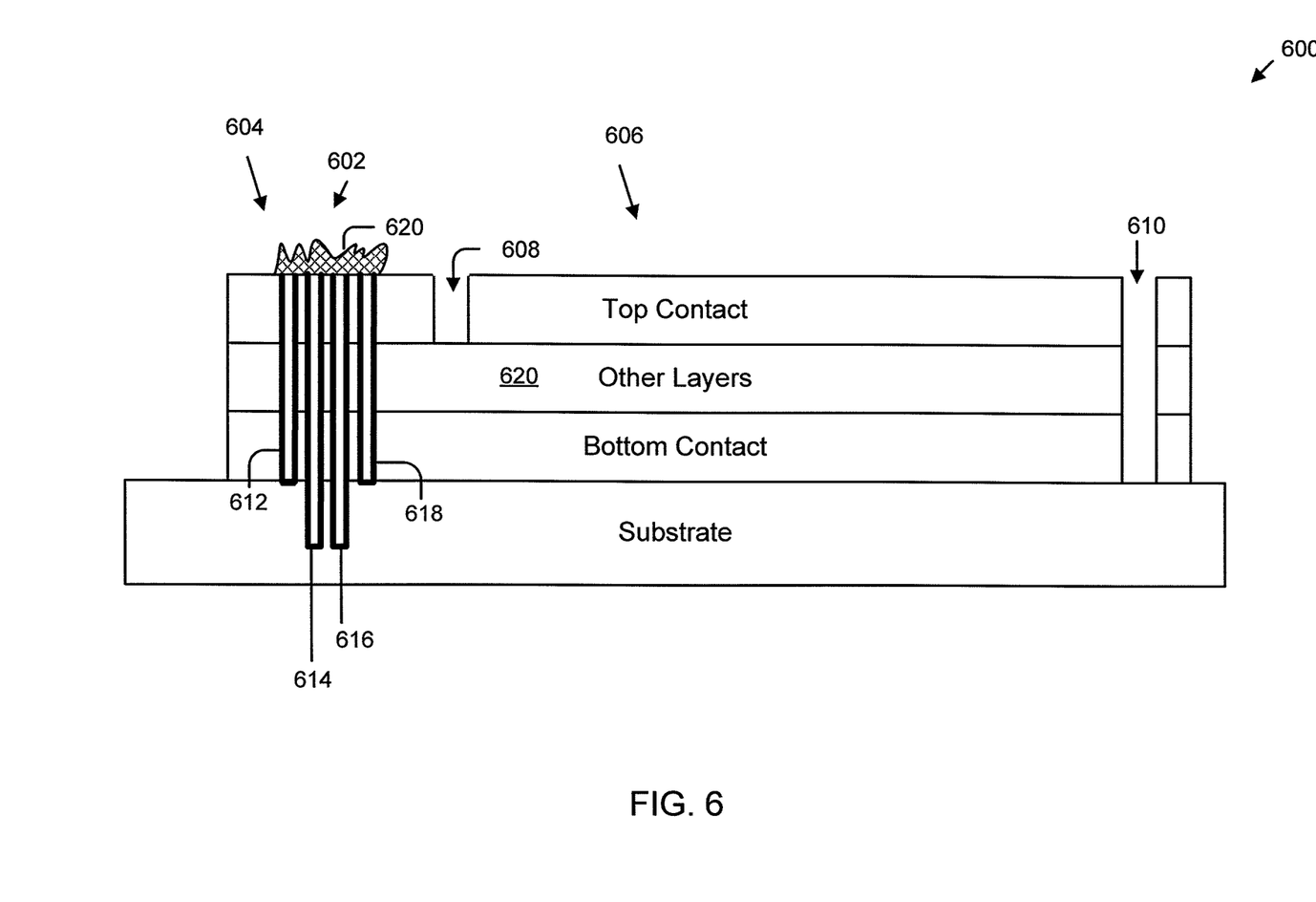
FIG. 6 illustrates a vertical cross-section of an alternative embodiment of a thin film solid state device in which the interconnects are created by laser perforation to create conductive interconnects from reflowed conductive and non-conductive layer material.

An alternative embodiment of a thin film solid state device is illustrated in FIG. 6. Device 600 may include a top contact layer, other layers, a bottom contact, and a substrate as previously described above. In the embodiment shown, the plurality of electrically conductive interconnects 602 are created by laser melting of layer material at the location of the desired interconnects 602. As described previously, the top contact layer may be divided into two portions. A first top contact layer portion 604 may be electrically isolated from a second top contact layer portion 606 by a separating etch 608, which may or may not be subsequently filled with nonconductive material. Other etches, such as etch 610 may further segment the top contact layer to define the extent of the single device 600 on the substrate. Additional etches of some or all layers (not shown) may also be used to achieve different architectures as needed.

In embodiments such as that shown in FIG. 6 in which multiple interconnects created by laser scribing are used, the device again has an interconnect-top contact area as described before, but now containing interconnects created by laser scribing. The interconnect-top contact area will include some amount of a top contact material area (i.e., that portion of the top contact layer surface that is within the interconnect-top contact area) and some amount of interconnect material area (i.e., the cross-sectional area of all of the interconnects at a plane such as the surface of the top contact layer).

In a laser scribing embodiments, the laser is used to melt a select volume of material of the layers. This material may then be allowed to resolidify to form the conductive interconnects. The process of heating, melting and then allowing the material to resolidify may be referred to as reflowing the material. In embodiments of the devices described herein, the laser scribing process may be controlled to cause the normally, relatively non-conductive material (e.g., metal oxides) of the other layers 620 to become conductive material after reflowing to form the interconnects 612, 614, 616, 618. For example, in an embodiment the process may be controlled so that some or all of the oxygen in the metal oxides are driven out of the reflowed material resulting in a more conductive reflowed interconnect material. This eliminates the step of adding the conductive material to create the interconnects and thus is a more efficient manufacturing process. In the method of manufacture, the layer both creates the interconnect cavity (in this case simply a region of melted material clang the cavity within the solid material of the layers instead of being an empty space) and the interconnect material is formed within the cavity from the original material at that location by the reflowing process without the need to add any extra material or fill the cavity. In an embodiment, the material volume is essentially conserved and the resulting reflowed interconnect material, which will be a mixture of reflowed material from all the layers penetrated by the interconnect, may substantially or entirely fill the interconnect.

In an alternative embodiment, some of the material may be vaporized or the volume otherwise reduced resulting in a cavity lined with conductive reflowed material but potentially containing some amount of void space in the interconnect. This embodiment is illustrated in FIG. 6 with the thick black lines of the interconnects 612, 614, 616, 618 provided to show the reflowed material. In yet another embodiment, the laser scribing process may be controlled so that the interconnect material is created from the top contact material that is melted and allowed to flow into the cavity in the other layers. The flow of the melted material may be such that it flows through multiple intermediate layers to the bottom contact. The melted material may then solidify. The solidified material may be electrically conductive. For example, the top contact material may be conductive, and the conductive material may flow down the walls of the cavity.

Control of the laser may be accomplished by controlling the laser energy, color, and duration and will be further affected by the materials used, the process conditions such as temperature, pressure and atmosphere as is known in the art. For example, ambient gas may affect the chemical composition of the reflowed material created. For example, gas mixtures may be anoxic, oxidizing, or reactive in nature. Reactive mixtures may be used to cause a chemical reaction between the reflowed material the gas to achieve an interconnect material with target properties. Gas mixtures may include one or more of the following gases: oxygen, carbon dioxide, hydrogen, nitrogen, helium, argon, fluorine and chlorine.

The laser may be used to create a specified pattern of electrically conductive interconnect depths. For example, the laser may be used to create a v-shaped pattern, such as the pattern illustrated by interconnects 612, 614, 616, and 618.

A conductive bridge 620 may cap the electrically conductive interconnect 602. This conductive bridge may be formed by using a conductive ink or conductive paste. Alternatively, the conductive bridge 620 may be formed when another conductive layer is deposited over the top contact layer. Additionally, the conductive cap 620 may be formed by using a laser to melt and reflow material in a specific pattern.

It will be clear that the systems and methods described herein are well adapted to attain the ends and advantages mentioned as well as those inherent therein. Those skilled in the art will recognize that the methods and systems within this specification may be implemented in many manners and as such is not to be limited by the foregoing exemplified embodiments and examples. In other words, functional elements being performed by a single or multiple components and individual functions can be distributed among different components. In this regard, any number of the features of the different embodiments described herein may be combined into one single embodiment and alternate embodiments having fewer than or more than all of the features herein described as possible.

While various embodiments have been described for purposes of this disclosure, various changes and modifications may be made which are well within the scope of the disclosed methods. Numerous other changes may be made which will readily suggest themselves to those skilled in the art and which are encompassed in the spirit of the disclosure.

What is claimed:

1. A multi layered fabricated electrical device to increase the usable surface area of electrically conductive interconnects comprising:
   a bottom contact layer;
   a top contact layer; and
   one or more intermediate insulating metal oxide layers between the top contact layer and the bottom contact layer,
   wherein the top contact layer comprises:
      a first top contact layer portion electrically isolated from one or more other top contact layer portions, wherein the first top contact layer portion includes:
      a plurality of spaced apart, electrically conductive interconnects that penetrates the first top contact layer portion in an interconnect-top contact area, the interconnect-top contact area defined as a minimum rectangular area of a surface of the first top contact layer portion that contains all of the electrically conductive interconnects of the plurality of spaced apart, electrically conductive interconnects such that the interconnect-top contact area includes a top contact material area and an electrically conductive interconnect material area, wherein the percentage of the electrically conductive interconnect material area is between 10% and 90% of the interconnect-top contact area; wherein the electrically conductive interconnects are formed of a reflowed material from the top contact layer, the one or more intermediate layers and the bottom contact layer.

2. The multi layered fabricated electrical device of claim 1, wherein each of the plurality of spaced apart, electrically conductive interconnects is completely filled with the melted and solidified material from the top contact layer, the one or more intermediate layers and the bottom contact layer.

3. The multi layered fabricated electrical device of claim 1, wherein the plurality of spaced apart, electrically conductive interconnects penetrates through the intermediate layers to the bottom layer.

4. The multi layered fabricated electrical device of claim 1, wherein the one or more layers between the top contact layer and the bottom contact layer is selected from the group consisting of lithium phosphorus oxynitride and paper.

5. The multi layered fabricated electrical device of claim 1, wherein the plurality of spaced apart, electrically conductive interconnects consists of a number of spaced apart, electrically conductive interconnects selected from the group consisting of at least 5, at least 10, at least 15, at least 20, at least 25, at least 30, at least 35, at least 40, at least 45, at least 50, at least 55, at least 60, at least 65, at least 70, at least 75, at least 80, at least 85, at least 90, at least 95, at least 100, and at least 200.

6. The multi layered fabricated electrical device of claim 1, wherein the percentage of surface that the electrically conductive interconnect material area occupies of the interconnect-top contact area is selected from the group consisting of an area greater than 10%, greater than 15%, greater than 20%, greater than 25%, greater than 30%, greater than 35%, greater than 40%, greater than 45%, greater than 50%, greater than 55%, greater than 60%, greater than 65%, greater than 70%, greater than 75%, greater than 80%, and greater than 85%.

7. The multi layered fabricated electrical device of claim 1, wherein the percentage of surface that the electrically conductive interconnect material area occupies of the interconnect-top contact area is selected from the group consisting of an area less than 15%, less than 20%, less than 25%, less than 30%, less than 35%, less than 40%, greater than 45%, greater than 50%, less than 55%, less than 60%, less than 65%, less than 70%, less than 75%, less than 80%, less than 85%, and less than 90%.

8. The multi layered fabricated electrical device of claim 1, wherein each electrically conductive interconnect has a cross-sectional area of a shape independently selected from a circle, an oval, a rectangle, and a predetermined polygon.

9. The multi layered fabricated electrical device of claim 1, wherein the plurality of spaced apart, electrically conductive interconnects penetrates to a predetermined depth below the top contact layer.

10. The multi layered fabricated electrical device of claim 1, wherein the top contact material area and the electrically conductive interconnect material area form a predetermined pattern.

11. The multi layered fabricated electrical device of claim 10, wherein the predetermined pattern is selected from a group consisting of regular pattern, a circular pattern, a grid pattern, and an irregular pattern.

12. The multi layered fabricated electrical device of claim 1, wherein the device is selected from a group consisting of a solid state battery, a solar cell, and a semiconductor device.

13. The multi layered fabricated electrical device of claim 1, further comprising: a conductive bridge, wherein the conductive bridge electrically couples one of the spaced apart, electrically conductive interconnects to one or more other spaced apart, electrically conductive interconnects.

14. The multi layered fabricated electrical device of claim 13, wherein the conductive bridge is a conductive paste.

15. The multi layered fabricated electrical device of claim 9, wherein the plurality of spaced apart, electrically conductive interconnects includes a first set of interconnects and a second set of interconnects and wherein each interconnect in the first set of interconnects penetrates to a first predetermined depth and each interconnect in the second set of interconnects penetrates to a second predetermined depth different from the first predetermined depth.

16. The multi layered fabricated device of claim 1, wherein the electrically conductive interconnects are formed by welding a conductive pathway.

17. A multi layered fabricated electrical device to increase the usable surface area of electrically conductive interconnects comprising:
   a bottom contact layer;
   a top contact layer; and
   one or more intermediate layers between the top contact layer and the bottom contact layer,
   wherein the top contact layer comprises:
      a first top contact layer portion electrically isolated from one or more other top contact layer portions, wherein the first top contact layer portion includes:
      a plurality of spaced apart, electrically conductive interconnects that penetrates the first top contact layer portion in an interconnect-top contact area, the interconnect-top contact area defined as a minimum rectangular area of a surface of the first top contact layer portion that contains all of the electrically conductive interconnects of the plurality of spaced apart, electrically conductive interconnects such that the interconnect-top contact area includes a top contact material area and an electrically conductive interconnect material area, wherein the percentage of the electrically conductive interconnect material area is between 10% and 90% of the interconnect-top contact area.

18. The multi layered fabricated electrical device of claim 17, wherein the plurality of spaced apart, electrically conductive interconnects consists of a number of spaced apart, electrically conductive interconnects selected from the group consisting of at least 5, at least 10, at least 15, at least 20, at least 25, at least 30, at least 35, at least 40, at least 45, at least 50, at least 55, at least 60, at least 65, at least 70, at least 75, at least 80, at least 85, at least 90, at least 95, at least 100, and at least 200.

19. The multi layered fabricated electrical device of claim 17, wherein the percentage of surface that the electrically conductive interconnect material area occupies of the interconnect-top contact area is selected from the group consisting of an area greater than 10%, greater than 15%, greater than 20%, greater than 25%, greater than 30%, greater than 35%, greater than 40%, greater than 45%, greater than 50%, greater than 55%, greater than 60%, greater than 65%, greater than 70%, greater than 75%, greater than 80%, and greater than 85%.

20. The multi layered fabricated electrical device of claim 17, wherein each electrically conductive interconnect has a cross-sectional area of a shape independently selected from a circle, an oval, a rectangle, and a predetermined polygon.

\* \* \* \* \*